(12) United States Patent
Huang

(10) Patent No.: US 11,038,489 B2
(45) Date of Patent: Jun. 15, 2021

(54) ACOUSTIC WAVE BAND-PASS FILTER WITH LOW LOSS LC NOTCH MATCHING NETWORK

(71) Applicant: Resonant Inc., Goleta, CA (US)

(72) Inventor: Yu-Ting Huang, Burlingame, CA (US)

(73) Assignee: Resonant Inc., Austin, TX (US)

( * ) Notice: Subject to any disclaimer, the term of this patent is extended or adjusted under 35 U.S.C. 154(b) by 13 days.

(21) Appl. No.: 16/549,655

(22) Filed: Aug. 23, 2019

(65) Prior Publication Data

US 2021/0058065 A1 Feb. 25, 2021

(51) Int. Cl.
*H03H 9/54* (2006.01)
*H03H 7/38* (2006.01)

(52) U.S. Cl.
CPC .............. *H03H 9/542* (2013.01); *H03H 7/38* (2013.01)

(58) Field of Classification Search
CPC ................................. H03H 9/542; H03H 7/38
See application file for complete search history.

(56) References Cited

U.S. PATENT DOCUMENTS

2019/0356283 A1* 11/2019 Chen ...................... H03F 3/211
2020/0021274 A1* 1/2020 Wagner .................. H03H 9/545

\* cited by examiner

*Primary Examiner* — Samuel S Outten
(74) *Attorney, Agent, or Firm* — SoCal IP Law Group LLP; John E. Gunther

(57) ABSTRACT

A band-pass filter (BPF) having first and second ports includes an acoustic wave filter (AWF) having first and second ports, the first port of the AWF coupled to the first port of the BPF. An impedance matching network consisting of a first inductor in parallel with a series combination of a second inductor and a capacitor is connected across the first port of the BPF.

10 Claims, 9 Drawing Sheets

$$L_1 = \frac{L_a L_2 (1 - (f_{notch}/f_0)^2)}{\{L_2(1 - (f_{notch}/f_0)^2) - L_a\}} \quad (3)$$

$$f_{notch} = \frac{1}{2\pi\sqrt{L_2 C_1}} \quad (4)$$

©2019 RESONANT INC.

ACOUSTIC WAVE BAND-PASS FILTER WITH LOW LOSS LC NOTCH MATCHING NETWORK

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "passband" of the filter. The range of frequencies stopped by such a filter is referred to as the "stop-band" of the filter. A typical RF filter has at least one passband and at least one stop-band. A band-pass filter is a type of RF filter that has a passband and stop-bands at frequencies above and below the passband. Specific requirements on a passband or stop-band depend on the specific application. For example, a "passband" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. In some applications, an acoustic wave filter alone may not provide a required level of attenuation in a stop-band. In such situations, additional attenuation may be provided by addition filter elements, such as an LC notch filter.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
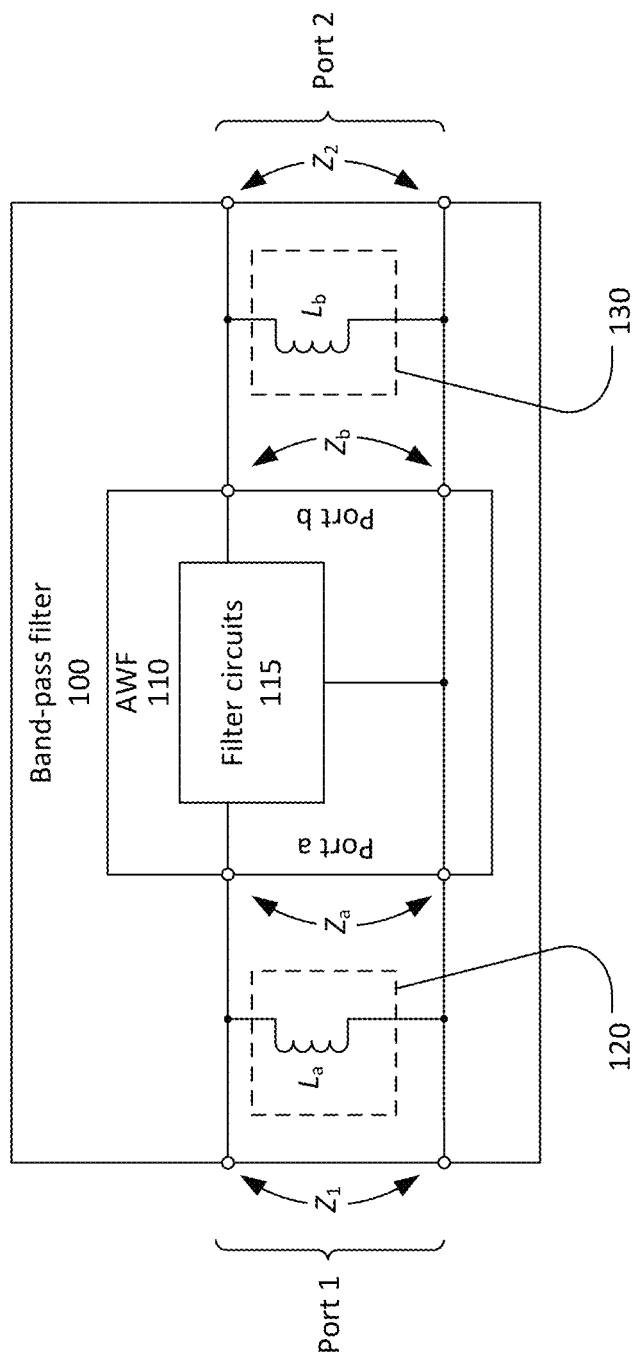
FIG. 1 is a schematic diagram of an acoustic wave band-pass filter with impedance matching networks comprising shunt inductors.

FIG. 1 is a schematic diagram of a band-pass filter (BPF) 100 including an acoustic wave filter (AWF) 110 and impedance matching networks 120 and 130. The AWF 110 is configured to pass a defined passband and to stop one or more defined stop-bands. The passband and stop-band(s) of the AWF 110 determine the passband and stop-band(s) of the BPF 100. The BPF 100 has two signal ports, labeled "Port 1" and "Port 2", either of which may be used as the input or output of the BPF. Each of the two ports has two terminals, one of which may commonly be connected to ground.

Typically, the specifications of a band-pass filter require the impedances, measured between the two terminals of each port, to equal or approximate respective target impedance values. The impedance requirement may be expressed as a maximum voltage standing wave ratio, a maximum return loss, or in some other manner. In FIG. 1 and subsequent figures, $Z_1$ and $Z_2$ represent the respective target impedance values for Port 1 and Port 2. $Z_1$ and $Z_2$ are typically, but not necessarily, the same. $Z_1$ and $Z_2$ are commonly 50 ohms but may have other values.

The AWF also has two ports, labeled "Port a" and "Port b", either of which may be used as the input or output of the AWF. An RF signal applied to either Port a or Port b is transmitted to the other port via filter circuits 115. The filter circuits 115 defined the passband and stop-bands of the BPF 100. $Z_a$ and $Z_b$ are the impedance of port 1 and port 2, respectively, of the AWF.

Port a of the AWF 110 is coupled to Port 1 of the BPF 100, which is to say the two terminals of Port a are connected to the respective terminals of Port 1. Similarly, Port b of the AWF 110 is coupled to Port 2 of the BPF 100. Ideally, $Z_a$ and $Z_b$ will be equal to, or closely approximate, $Z_1$ and $Z_2$. In this case, the impedance matching networks 120 and 130 may not be required. In practice, one or both of the impedances $Z_a$ and $Z_b$ of the AWF 110 may differ from the respective target values $Z_1$ and $Z_2$.

The impedance matching networks 120, 130 compensate for the differences between the impedances $Z_a$ and $Z_b$ of the AWF 110 and the target values $Z_1$ and $Z_2$. Impedance matching network 120 is connected across Port 1, which is to say impedance matching network 120 is connected between the two terminals of Port 1. Similarly, impedance matching network 130 is connected across Port 2. In this example, the impedance matching networks 120 and 130 comprise respective inductors $L_a$ and $L_b$. For convenience, the notations $L_a$ and $L_b$ will be used to represent both the components in the schematic diagram, and the inductance values of those components. The value $L_a$ of the shunt inductor of impedance matching network 120 is selected such that the impedance at Port 1 of the band-pass filter 100 is equal to its target value $Z_1$ for at least a portion of the passband of the band-pass filter 100. Compensating for the difference between an actual impedance and a desired impedance is commonly referred to as "impedance matching." The inductance value $L_a$ is selected to "match" the impedance $Z_a$ of the AWF 110 to the desired impedance $Z_1$. Similarly, the value $L_b$ of the shunt inductor of impedance matching network 130 is selected to match the impedance $Z_b$ of the AWF 110 to the desired impedance $Z_2$ for at least a portion of the passband of the band-pass filter 100. For example, the inductance values $L_a$ and $L_b$ may be selected such that the impedances at Port 1 and Port 2 match the respective desired impedance values $Z_1$ and $Z_2$ at the center frequency of the passband of the band-pass filter 100.

It should be understood that the impedances $Z_a$ and $Z_b$ are characteristics of the AWF 110 and, consequently, the differences between the impedances $Z_a$ and $Z_b$, and $Z_1$ and $Z_2$, respectively, are characteristics of the AWF 110. Similarly, the inductance values $L_a$ and $L_b$ needed to match the impedances $Z_a$ and $Z_b$ to $Z_1$ and $Z_2$, respectively, are also characteristics of the AWF 110. Different AWF designs for the same frequency band may require different inductance values $L_a$ and $L_b$. AWF designs for different frequency bands are likely to require different inductance values $L_a$ and $L_b$.

Figure 2:
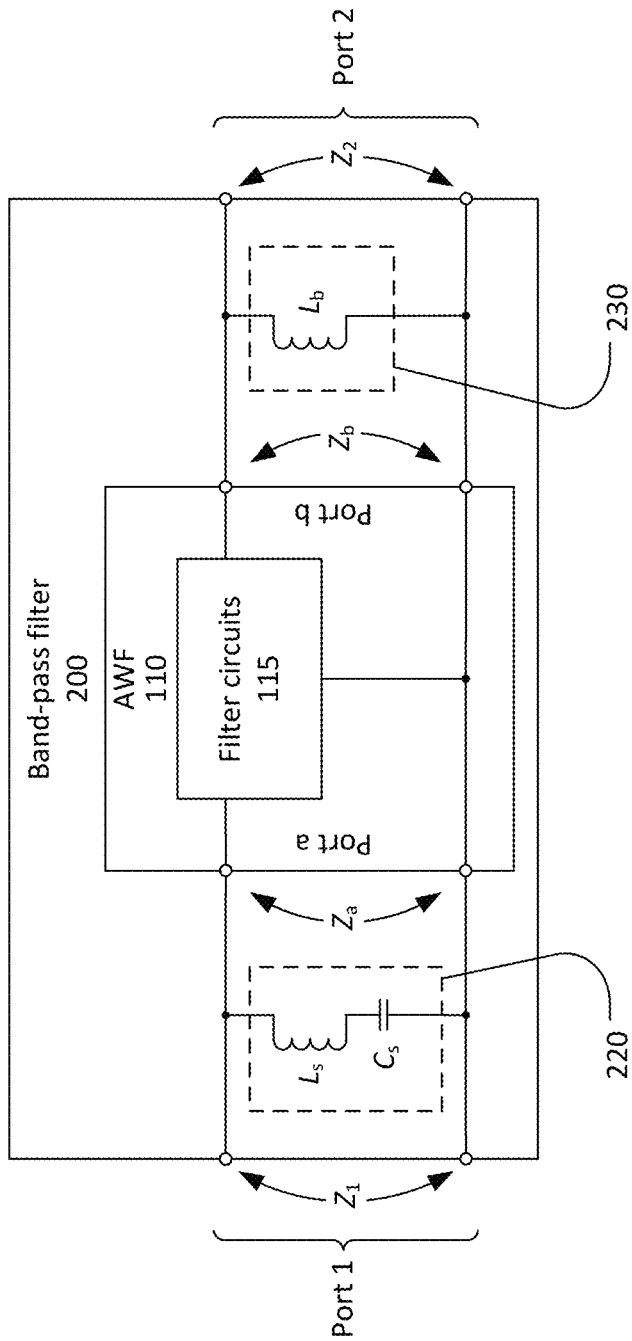
FIG. 2 is a schematic diagram of an acoustic wave band-pass filter with an impedance matching network comprising an LC notch filter.

In some circumstances, an acoustic wave filter may not provide sufficient attenuation in one or more stop-bands. In this situation, the attenuation of the AWF may be augmented with an L/C notch filter, as shown in FIG. 2. FIG. 2 is a schematic diagram of an acoustic wave band-pass filter 200 including the AWF 110 and impedance matching networks 220 and 230. Impedance matching networks 220 and 230 are connected across Port 1 and Port 2, respectively, of the band-pass filter 200. Impedance matching network 230 is a single inductor, with inductance value $L_b$, that matches the impedance $Z_b$ to $Z_2$.

Impedance matching network 220 is a series resonant circuit including inductor $L_s$ and capacitor $C_s$. The impedance matching network 220 performs the functions of (1) matching the impedance $Z_a$ to the target impedance $Z_1$ for at least some frequency within the passband of the band-pass filter 200, and (2) creating a notch (i.e. a transmission minimum) at a desired frequency outside of the passband of the band-pass filter 200.

To match $Z_a$ to $Z_1$, the reactance of the series combination of $L_s$ and $C_s$ must equal the reactance of $L_a$ for at least one frequency within the passband of the band-pass filter 200. Typically, $L_s$ and $C_s$ are selected such that the reactance of the series combination is equal to the reactance of $L_a$ at the center frequency of the passband. To this end, $L_s$ and $C_s$ are selected in accordance with the formulas:

$$L_s = \frac{L_a}{1 - (f_{notch}/f_0)^2} \quad (1)$$

$$f_{notch} = \frac{1}{2\pi\sqrt{L_s C_s}} \quad (2)$$

where $f_{notch}$ is the frequency of the desired transmission minimum and $f_0$ is a frequency (typically the center frequency) within the passband of the band-pass filter 200. Since two degrees of freedom (the values of $L_s$ and $C_s$) are available to satisfy two objectives (a notch at a particular frequency and a specific admittance at another frequency), there is only one unique pair of values for $L_s$ and $C_s$ that satisfies both objectives. The required values of $L_s$ and $C_s$ may not be convenient or practical to implement.

Figure 3:
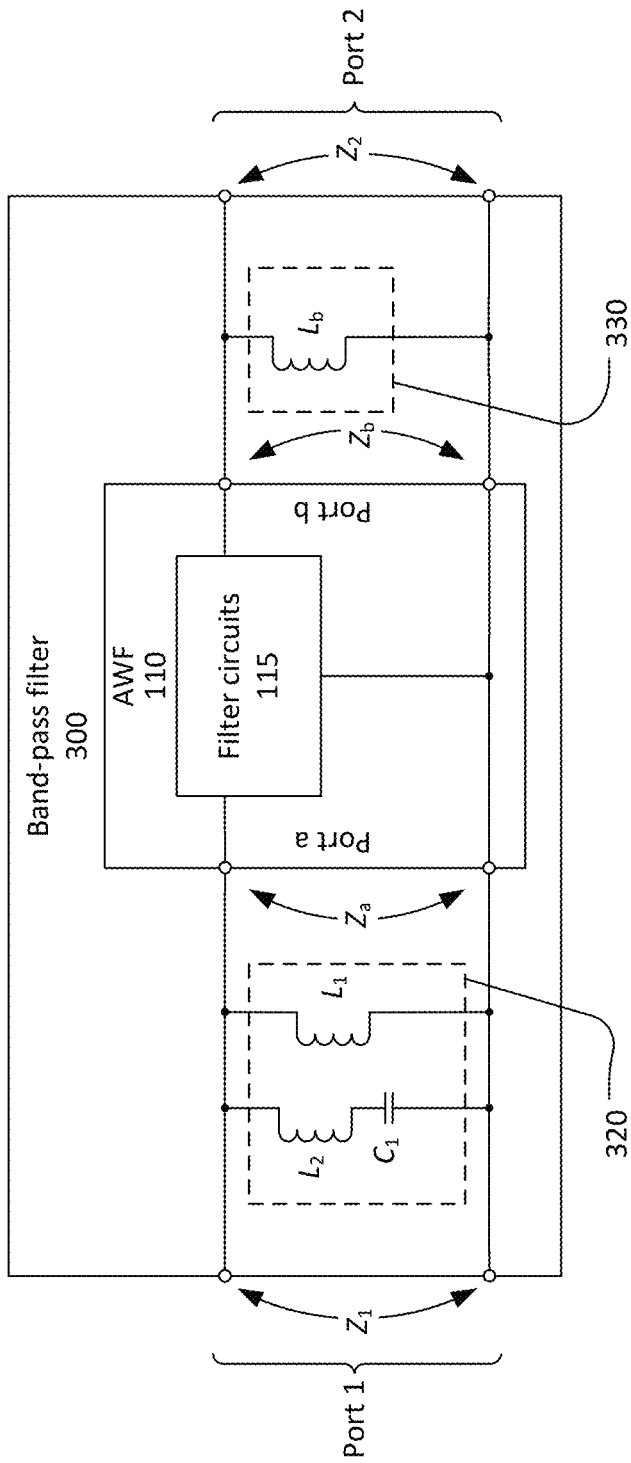
FIG. 3 is a schematic diagram of an acoustic band-pass filter with an impedance matching network comprising an LC notch filter and a shunt inductor.

FIG. 3 is a schematic diagram of an acoustic wave band-pass filter 300 including the AWF 110 and impedance matching networks 320 and 330. Impedance matching networks 320 and 330 are connected across Port 1 and Port 2, respectively, of the band-pass filter 300. Impedance matching network 330 is a single inductor, with inductance value $L_b$, that matches the impedance $Z_b$ to $Z_2$.

Impedance matching network 320 includes a shunt inductor $L_1$ in parallel with a series resonant circuit including inductor $L_2$ and capacitor $C_1$. The impedance matching network 320 performs the functions of (1) matching the impedance $Z_a$ to the target impedance $Z_1$, and (2) creating a notch (i.e. a transmission minimum) at a desired frequency outside of the passband of the band-pass filter 300.

To match $Z_a$ to $Z_1$, the reactance of the impedance matching network 320 must equal the reactance of $L_a$ for at least one frequency within the passband of the band-pass filter 300. Typically, the values of the components in the impedance matching network are selected such that the reactance of the impedance matching network is equal to the reactance of $L_a$ at the center frequency of the passband. To this end, $L_1$ and $L_2$ are selected in accordance with the formula:

$$L_1 = \frac{L_a L_2 (1 - (f_{notch}/f_0)^2)}{(L_2(1 - (f_{notch}/f_0)^2) - L_a)}. \quad (3)$$

The value of $C_1$ is then determined from the formula:

$$f_{notch} = \frac{1}{2\pi\sqrt{L_2 C_1}}. \quad (4)$$

$f_{notch}$ is the frequency of the desired transmission minimum and $f_0$ is a frequency (typically the center frequency) within the passband of the band-pass filter 300. Since three degrees of freedom (the values of $L_1$, $L_2$, and $C_1$) are used to satisfy two objectives (a notch at a particular frequency and a specific admittance at another frequency), there are an unlimited number of combinations of $L_1$, $L_2$, and $C_1$ that satisfy both objectives. Given the "extra" degree of freedom, the values of $L_1$, $L_2$, and $C_1$ can be selected to satisfy a third objective, such as minimizing the insertion loss of the band-pass filter 300 within its passband.

Figure 4A:
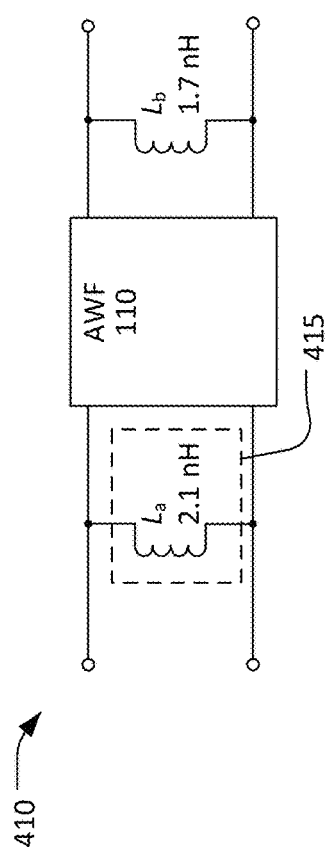
FIG. 4A, FIG. 4B, and FIG. 4C are schematic diagrams of exemplary acoustic wave band-pass filters with specific value for the components of the impedance matching networks.
Figure 4B:
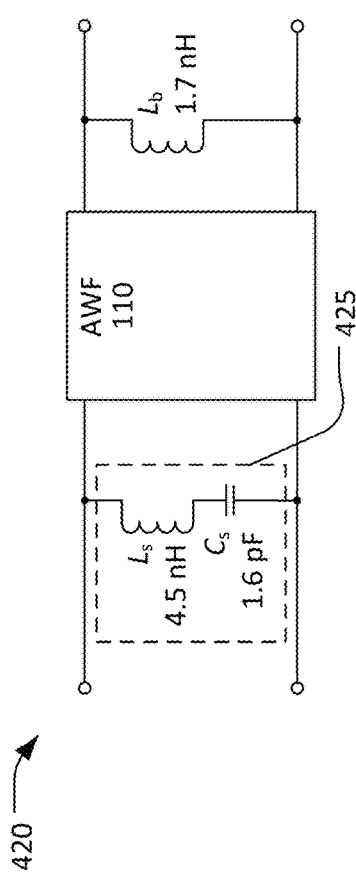
Figure 4C:
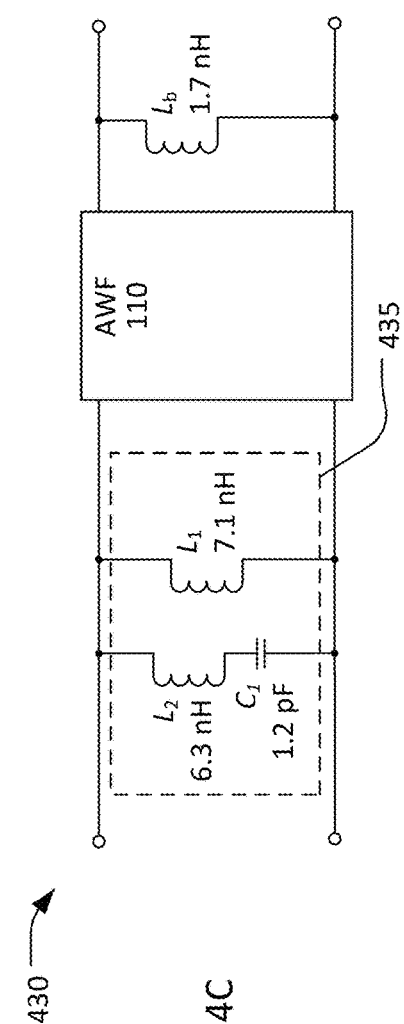

FIG. 4A, FIG. 4B, and FIG. 4C are schematic diagrams of band-pass filter 410, 420, and 430, which are specific embodiments of the band-pass filters 100, 200, and 300 of FIG. 1, FIG. 2, and FIG. 3, respectively. In each case, the AWF 110 is an LTE (Long Term Evolution) Band 41 filter with a passband from 2496 MHz to 2690 MHz.

In FIG. 4A, an impedance matching network 415 includes a 2.1 nH shunt inductance $L_a$ to match the impedance at Port 1 of the BPF 410 to $Z_1$ at the center of passband.

In FIG. 4B, an impedance matching network 425 includes a series combination of a 4.5 nH inductor $L_s$ and a 1.6 pF capacitor $C_s$. The impedance matching network 425 matches the impedance at Port 1 of the BPF 420 to $Z_1$ at the center of the passband and introduces a notch or transmission minimum at 1860 MHz.

In FIG. 4C, an impedance matching network 435 includes 7.1 nH inductor Li in parallel with a series combination of a 6.3 nH inductor $L_2$ and a 1.6 pF capacitor $C_1$. The impedance matching network 435 matches the impedance at Port 1 of the BPF 430 to $Z_1$ at the center of the passband and introduces a notch or transmission minimum at 1860 MHz. The impedance matching network 435 is also configured to reduce the insertion loss of the filter 430 in its passband relative to the insertion loss of the filter 420.

Figure 5:
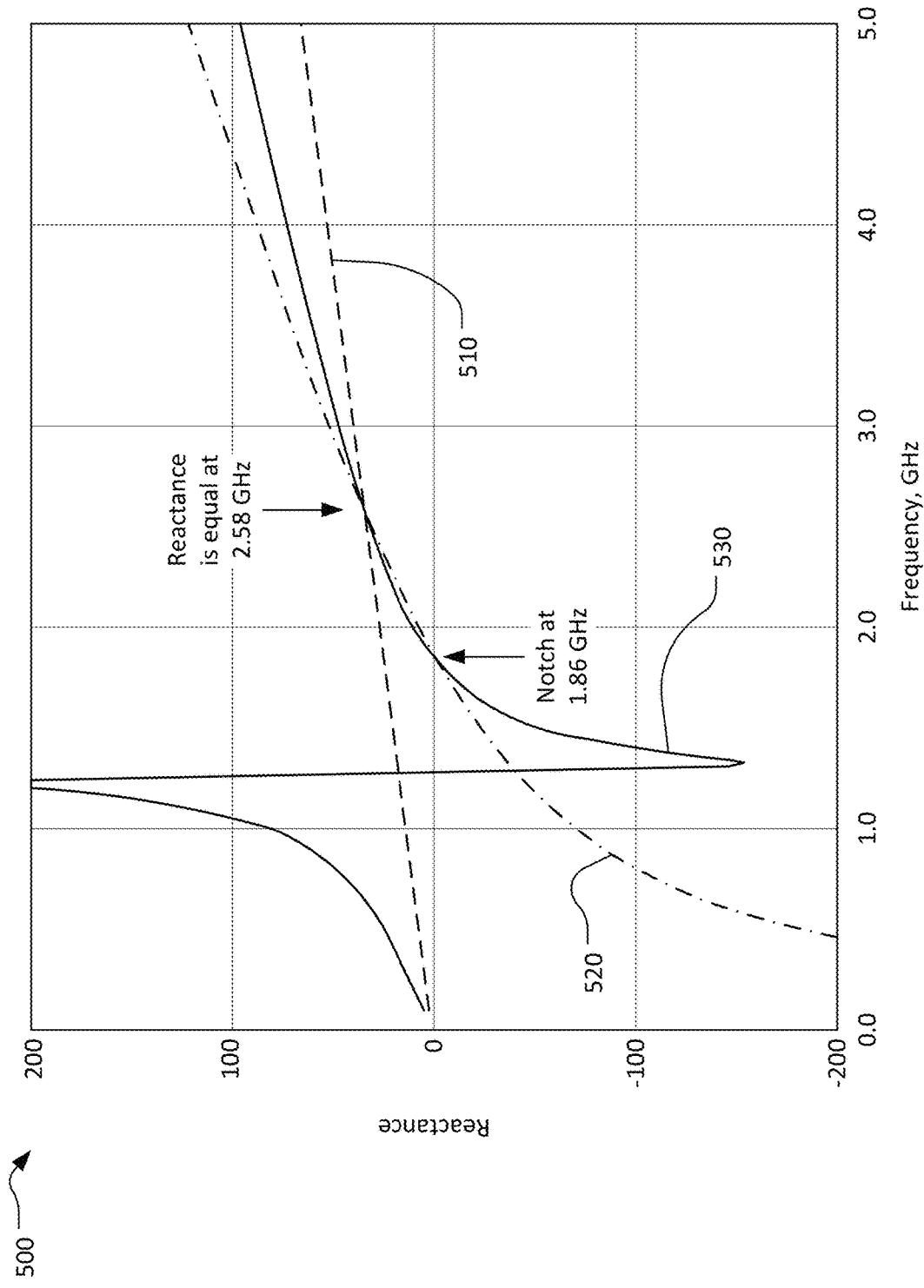
FIG. 5 is graph of reactance versus frequency for the impedance matching networks of FIG. 4A, FIG. 4B, and FIG. 4C.

FIG. 5 is a graph of the calculated reactance of the impedance matching networks 415, 425, and 435 of FIG. 4A, FIG. 4B and FIG.4C, respectively. The calculated reactance values are based on the assumptions that the Q factor of all inductors is 20 and the Q factor of all capacitors is 100. Specifically, the dashed straight line 510 is a plot of the reactance of the impedance matching network 415 as a function of frequency. The dash-dot line 520 is a plot of the reactance of the impedance matching network 425 as a function of frequency. The solid line 530 is a plot of the reactance of the impedance matching network 435 as a function of frequency. Note that the reactance of all three impedance matching networks are equal at 2.58 GHz, which is approximately the center of the passband of each filter 410, 420, 430. The impedance matching networks 425 and 435 provide a notch at 1.86 GHz where the reactance of each network is zero.

Figure 6:
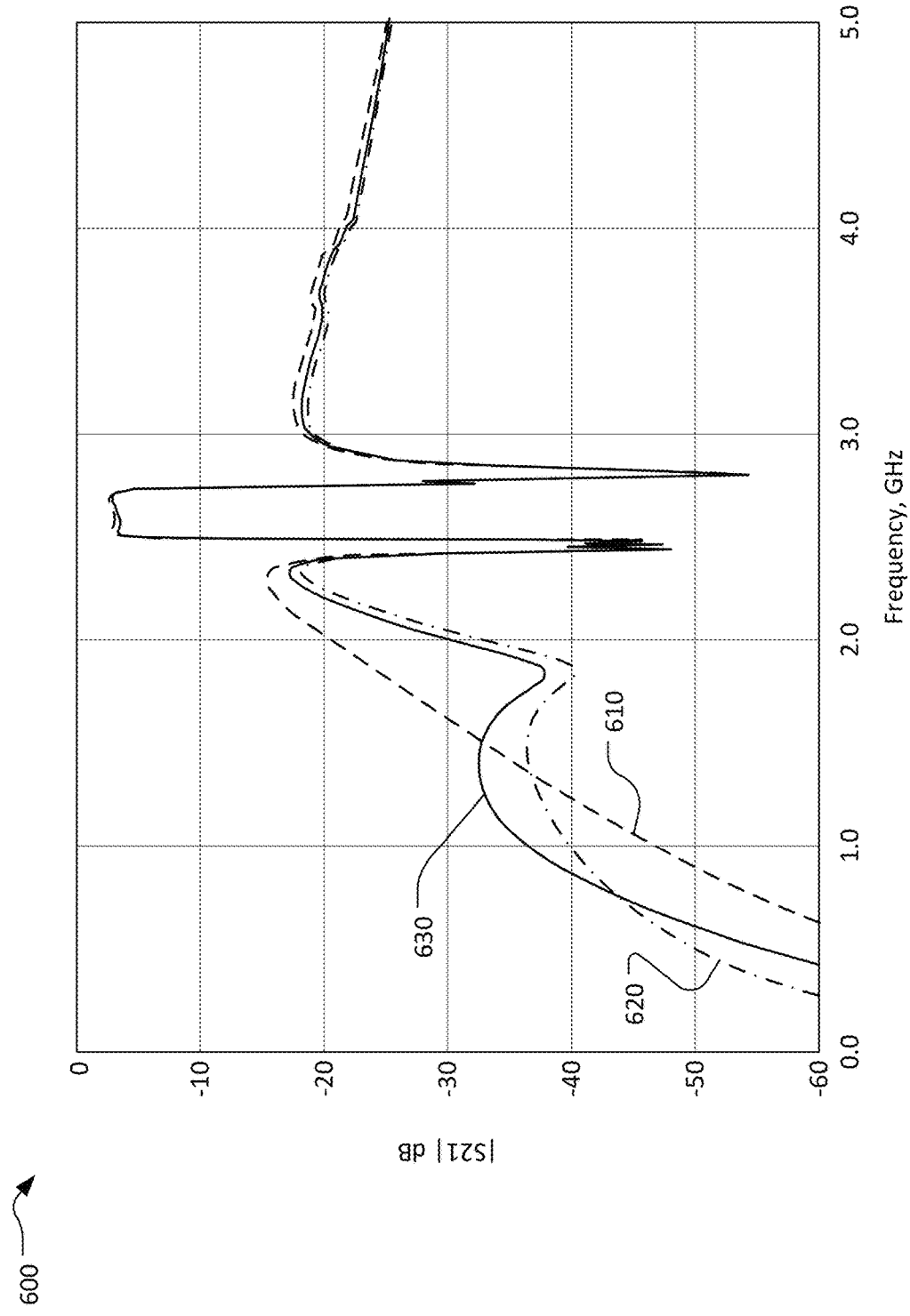
FIG. 6 is a graph of |S21| versus frequency for the exemplary acoustic wave band-pass filters of FIG. 4A, FIG. 4B, and FIG. 4C.
Figure 7:
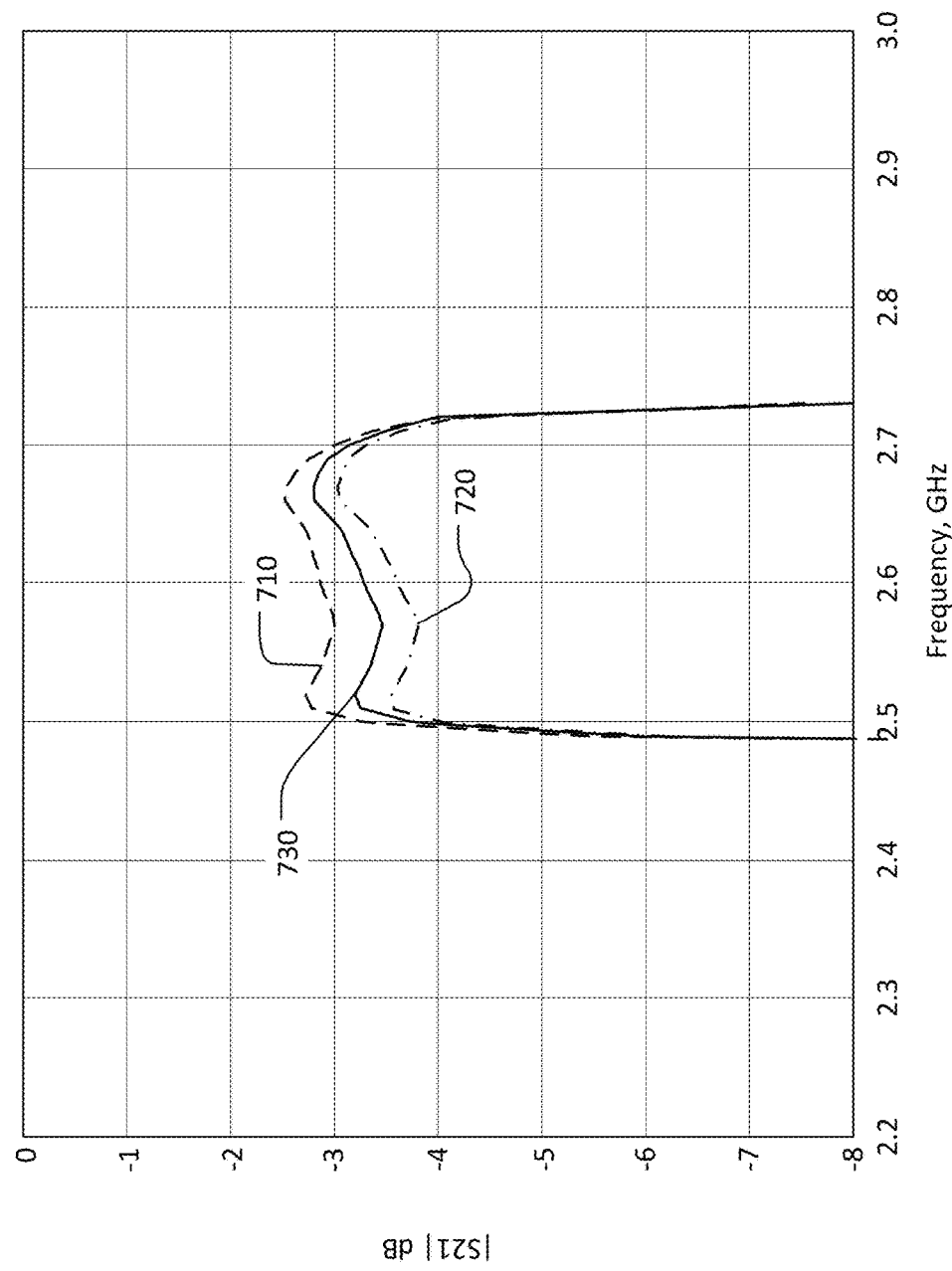
FIG. 7 is an expanded graph of |S21| versus frequency for the exemplary acoustic wave band-pass filters of FIG. 4A, FIG. 4B, and FIG. 4C.
Figure 8:
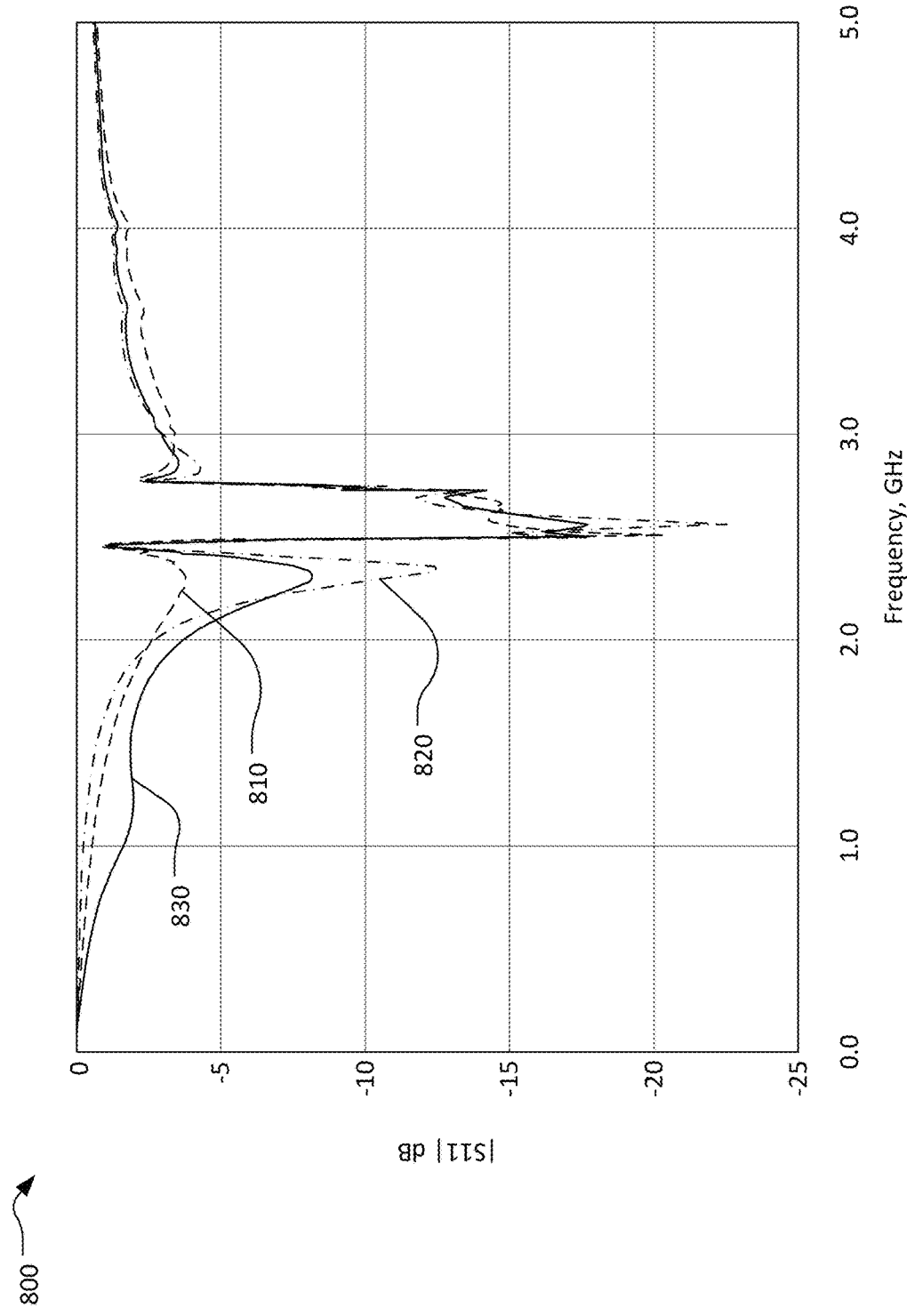
FIG. 8 is a graph of |S11| versus frequency for the exemplary acoustic wave band-pass filters of FIG. 4A, FIG. 4B, and FIG. 4C.

FIG. 6, FIG. 7, and FIG. 8 are graphs of S parameters for the band-pass filters 410, 420, and 430 of FIG. 4A, FIG. 4B and FIG.4C, respectively. These graphs are based on simulation of the filter circuits. The dashed lines 610, 710, 810 are plots of the S parameters of the filter 410 of FIG. 4A. The dash-dot lines 620, 720, and 820 are plots of the S parameters of the filter 420 of FIG. 4B. The solid lines 630, 730, and 830 are plots of the S parameters of the filter 430 of FIG. 4C.

FIG. 6 is a graph of S21, which is the Port 1 to Port 2 transfer function of each filter. Local minimums in S21 can be observed at 1.86 GHz for filter 420 (dash-dot line 620) and the filter 430 (solid line 630).

FIG. 7 is an expanded portion of FIG. 6. The improved transmission (reduced insertion loss) of the filter 430 (solid line 730) relative to the filter 420 (dash-dot line 720) can be observed.

FIG. 8 is a graph of S11, which is the return reflection at Port 1. The return reflection in the passband is comparable for all three filters.

The filter circuits shown in FIG. 1 to FIG. 4C are exemplary. An impedance matching circuit including a shunt inductor in parallel with a series combination of an inductor and a capacitor may be used with acoustic filters for other frequency bands. While the preceding examples are limited to providing a transmission minimum at a frequency below the passband, an impedance matching circuit including a shunt inductor in parallel with a series combination of an inductor and a capacitor may be used to create a transmission minimum at a frequency above the passband of a band-pass filter. Further, impedance matching circuits including a shunt inductor in parallel with a series combination of an inductor and a capacitor may be used on both sides of a band-pass filter to create two transmission minimums, which may be at the same frequency or two different frequencies, each of which may be above or below the passband.

Figure 9:
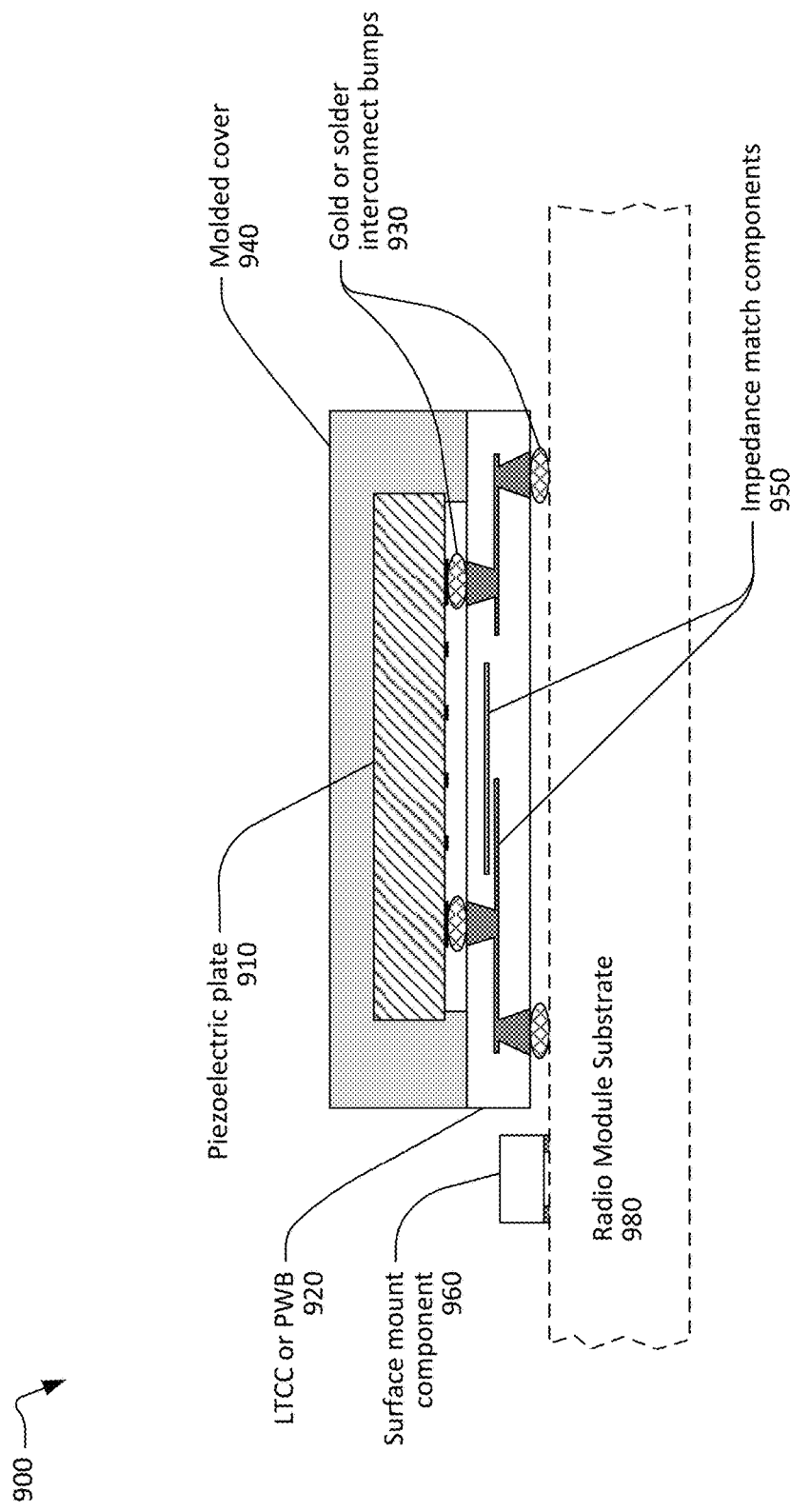
FIG. 9 is a schematic cross-sectional view of an exemplary acoustic wave band-pass filter with an impedance matching network comprising an LC notch filter and a shunt inductor.

FIG. 9 is a schematic cross-sectional view of an exemplary packaged BPF 900. The BPF 900 includes an impedance matching network comprising an LC notch filter and a shunt inductor. The BPF 900 includes a piezoelectric plate 910 that is connected to an LTCC or printed wiring board 920 by gold or solder interconnect bumps 930. One or more acoustic resonators may be formed on a surface of the piezoelectric plate. The piezoelectric plate 910 may be a slab of single-crystal piezoelectric material or may be a thin wafer of piezoelectric material bonded to a substrate (not shown) such as a silicon wafer. The piezoelectric plater 910 and the wiring board 920 may be enclosed by a cover such as the molded plastic cover 940. Other types of interconnections and packages may be used. The wiring board may be connected to a radio module substrate external to the packaged BPF by additional gold or solder interconnect bumps 930.

One or more components of the impedance matching network may be implemented on the piezoelectric plate 910. For example, either or both of the inductors may be implemented as a long and/or serpentine conductor on the surface of the piezoelectric plate 910. The capacitor may be implemented, for example, as a group of interdigitated conductors on the surface of the piezoelectric plate 910.

One or more components of the impedance matching network may be implemented within the package structure of the BPF 900. For example, either or both of the inductors may be implemented as a long and/or serpentine conductor on one or more conductor layers of the wiring board 920. The capacitor may be implemented, for example, by overlapping conductors on two layers of the wiring board separated by a dielectric interlayer. Either or both of the inductors and the capacitor may be implemented by discrete components (not shown) disposed on the wiring board 920.

One or more components of the impedance matching network may be implemented external to the package structure of the BPF 900. For example, either or both of the inductors and the capacitor may be implemented by discrete components, such as surface mount component 960, disposed on the radio module substrate 980.

FIG. 9 and the corresponding description assume the BPF 900 use surface acoustic wave (SAW) resonators formed on the piezoelectric plate 910. An impedance matching network comprising an LC notch filter and a shunt inductor may be incorporated into, or used with, other types of acoustic resonators including bulk acoustic wave (BAW) resonators, film bulk acoustic ware resonators (FBARs), and microelectromechanical system (MEMS) resonators.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A band-pass filter (BPF) having first and second ports, comprising:
   an acoustic wave filter (AWF) having first and second ports, the first port of the AWF coupled to the first port of the BPF; and
   an impedance matching network connected across the first port of the BPF, the impedance matching network consisting of a first inductor in parallel with a series combination of a second inductor and a capacitor, wherein
   the impedance matching network is configured to match an impedance of the first port of the AWF to a target impedance, and create a transmission minimum at a frequency outside of a passband of the AWF, and
   inductances of the first and second inductor are related by the formula:

$$L_1 = \frac{L_a L_2 (1 - (f_{notch}/f_0)^2)}{(L_2(1 - (f_{notch}/f_0)^2) - L_a)}$$

where $L_1$ and $L_2$ are the inductances of the first and second inductors, respectively, $f_{notch}$ is the frequency of the transmission minimum, $f_0$ is a selected frequency within a passband of the AWF, and $L_a$ is an inductance of a hypothetical inductor required to match an impedance of the first port of the AWF to a target impedance value at the frequency $f_0$.

2. The band-pass filter of claim 1, wherein $L_2$ and a capacitance of the capacitor are related by the formula:

$$f_{notch} = \frac{1}{2\pi\sqrt{L_2 C_1}}$$

where $C_1$ is the capacitance of the capacitor.

3. The band-pass filter of claim 2, wherein $C_1$, $L_1$, and $L_2$ are selected to minimize an insertion loss of the BPF at some or all frequencies within the passband.

4. The band-pass filter of claim 1, wherein one or more of the first inductor, the second inductor, and the capacitor are realized in a package structure of the BPF.

5. The band-pass filter of claim 1, wherein one or more of the first inductor, the second inductor, and the capacitor are external to a package structure of the BPF.

6. A band-pass filter, comprising:
   an acoustic wave filter (AWF) having first and second ports, wherein
      the first port of the AWF has an impedance $Z_a$ that can be matched to a first target impedance at a frequency $f_0$ within a passband of the AWF by connecting an inductor with an inductance $L_a$ across the first port, and
      the second port of the AWF has an impedance $Z_b$ that can be matched to a second target impedance at frequency $f_0$ by connecting an inductor with an inductance $L_b$ across the second port; and
   an impedance matching network connected across the first port, the impedance matching network consisting of a first inductor in parallel with a series combination of a second inductor and a capacitor, wherein
   the impedance matching network is configured to match $Z_a$ to the first target impedance at frequency $f_0$ and create a transmission minimum at a frequency outside of the passband of the AWF, and
   inductances of the first and second inductor are related by the formula:

$$L_1 = \frac{L_a L_2 (1 - (f_{notch}/f_0)^2)}{(L_2(1 - (f_{notch}/f_0)^2) - L_a)}$$

where $L_1$ and $L_2$ are the inductances of the first and second inductors, respectively, and $f_{notch}$ is the frequency of the transmission minimum.

7. The band-pass filter of claim 6, wherein $L_2$ and a capacitance of the capacitor are related by the formula:

$$f_{notch} = \frac{1}{2\pi\sqrt{L_2 C_1}}$$

where $C_1$ is the capacitance of the capacitor.

8. The band-pass filter of claim 7, wherein $C_1$, $L_1$, and $L_2$ are selected to minimize an insertion loss of the BPF at some or all frequencies within the passband.

9. The band-pass filter of claim 6, wherein one or more of the first inductor, the second inductor, and the capacitor are realized in a package structure of the BPF.

10. The band-pass filter of claim 6, wherein one or more of the first inductor, the second inductor, and the capacitor are external to a package structure of the BPF.

* * * * *